United States Patent [19]

Yamada

[11] 4,141,023

[45] Feb. 20, 1979

[54] FIELD EFFECT TRANSISTOR HAVING A LINEAR ATTENUATION CHARACTERISTIC AND AN IMPROVED DISTORTION FACTOR WITH MULTIPLE GATE DRAIN CONTACTS

[75] Inventor: Takaaki Yamada, Atsugi, Japan

[73] Assignee: Sony Corporation, Tokyo, Japan

[21] Appl. No.: 845,712

[22] Filed: Oct. 26, 1977

Related U.S. Application Data

[63] Continuation of Ser. No. 687,900, May 19, 1976, abandoned, which is a continuation of Ser. No. 496,355, Aug. 9, 1974, abandoned.

[30] Foreign Application Priority Data

Aug. 11, 1973 [JP] Japan .................................. 48-90240

[51] Int. Cl.² ........................................... H01L 29/78
[52] U.S. Cl. ......................................... 357/23; 357/41; 357/51; 357/59; 307/304
[58] Field of Search .................. 357/23, 27, 41, 51, 357/59; 307/304

[56] References Cited

U.S. PATENT DOCUMENTS

| | | |
|---|---|---|
| 3,471,755 | 10/1969 | Bilotti ...................................... 357/23 |
| 3,673,471 | 6/1972 | Klein et al. ............................. 357/23 |
| 3,714,522 | 1/1973 | Kumiya et al. ......................... 357/23 |
| 3,714,523 | 1/1973 | Bate ......................................... 357/23 |
| 3,829,883 | 8/1974 | Bate ......................................... 357/23 |

OTHER PUBLICATIONS

C. Hu et al., "A Resistive-Gated IGFET Tetrode," IEEE Trans. on Elec. Dev., vol. ED-18, #7, Jul. 1971, pp. 418-425.

W. Chang et al., "C-C-D Magnetic Field Sensor," IBM Tech. Discl. Bull., vol. 14, #11, Apr. 1972, p. 3420.

J. Elliott et al., "Self-Limiting Off-Chip Driver," IBM Tech. Discl. Bull., vol. 16, #8, Jan. 1974, pp. 2679, and 2680.

Primary Examiner—Joseph E. Clawson, Jr.
Attorney, Agent, or Firm—Hill, Gross, Simpson, Van Santen, Steadman, Chiara & Simpson

[57] ABSTRACT

A field effect transistor having two electrodes and distributed resistance therebetween is disclosed. This device is used as an attenuator when a main signal is applied across one drain electrode and a source and a control voltage is applied between a gate and the source. The output is derived from the other drain electrode.

6 Claims, 14 Drawing Figures

Fig. 14

FIELD EFFECT TRANSISTOR HAVING A LINEAR ATTENUATION CHARACTERISTIC AND AN IMPROVED DISTORTION FACTOR WITH MULTIPLE GATE DRAIN CONTACTS

This is a continuation of application Ser. No. 687,900, filed May 19, 1977 which was a continuation of application 496,355 filed Aug. 9, 1974, both abandoned.

BACKGROUND OF THE INVENTION

1. Field of the Invention

The present invention relates to an improvement in a field effect transistor, and particularly to a field effect transistor which provides linearity to its attenuation characteristics and also improves its distortion factor to transmit a signal in a good condition when it is employed as an attenuator, by way of example.

2. Description of the Prior Art

Figure 1:
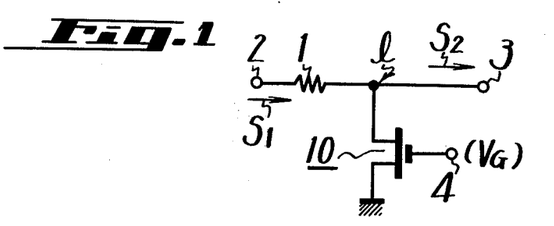
FIG. 1 is a circuit diagram showing one example of an attenuator circuit using a prior art FET.

When, for example, an insulated gate type (MOS-type) field effect transistor (hereinafter referred to as an FET) is used as a variable impedance element and also used in an attenuator circuit, a circuit arrangement such as depicted in FIG. 1 is generally adopted. In FIG. 1, reference numeral 1 designates a resistor interposed between input and output terminals 2 and 3 of a signal transmitting path 1 and a signal $S_1$ supplied to the input terminal 2 is controlled of the attenuation condition of its transmitting amount by an FET 10 connected in parallel to the transmitting path 1. In other words, the impedance between source and drain of the FET 10 is controlled by a control voltage (gate voltage) $V_G$ applied to its gate electrode 4 thereby to control the attenuation amount of the signal $S_1$.

In this connection, as is well known, the attenuation amount of an output signal $S_2$ controlled by the FET 10, that is, its gain $g_1$ is expressed as follows:

$$g_1 = \frac{1}{1 + \beta R B_G} \quad (1)$$

where R is the resistance value of the resistor 1 and $\beta$ is the proportional constant to determine the channel conductance of the FET 10 which is obtained by the following equation:

$$\beta = \frac{\epsilon_{OX}\mu}{T_{OX}} \cdot \frac{W}{L}$$

where $\epsilon_{OX}$ is the dielectric constant of a gate oxide film, $T_{OX}$ is the thickness of the gate oxide film, $\mu$ is the mobility of a carrier, L is the length of a channel, and W is the width of a channel.

Figure 2:
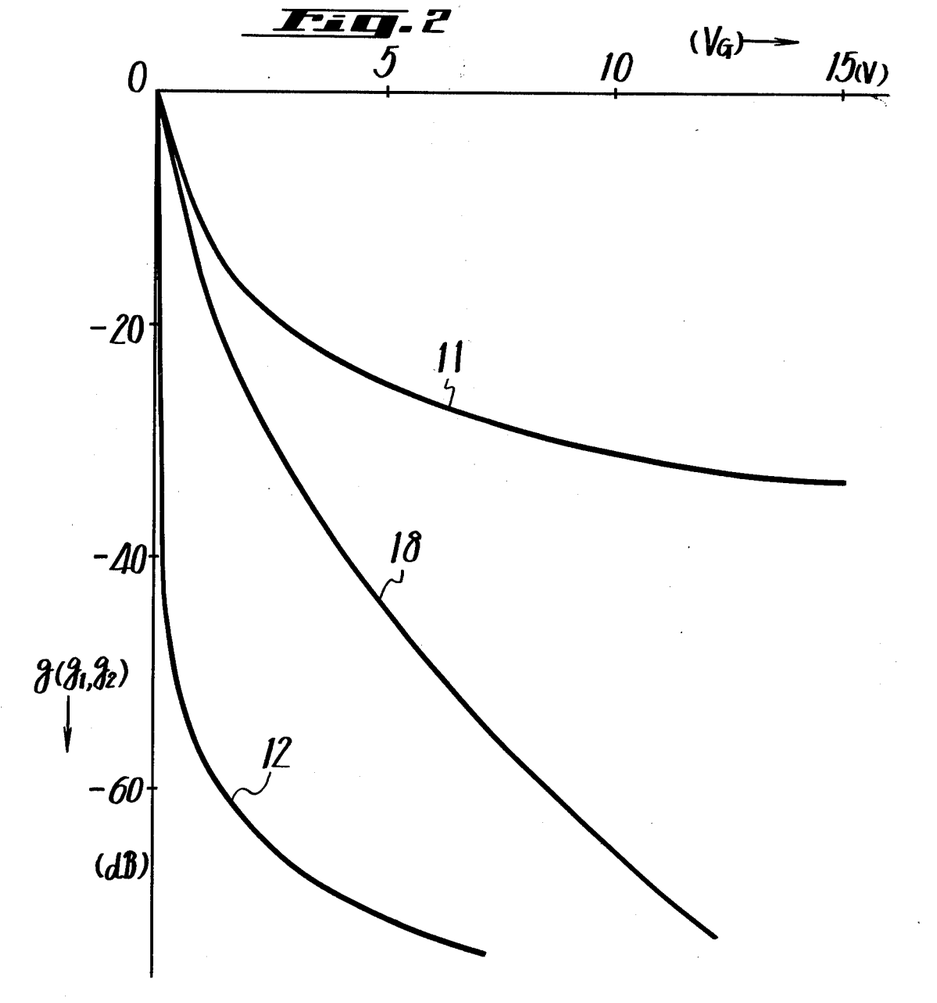
FIG. 2 is a graph showing the attenuation characteristics.

Accordingly, the equation (1) is expressed by curves such as in FIG. 2 wherein the abscissa represents the gate voltage $V_G$ and the ordinate represents the gain or attenuation amount g. A curve 11 indicates the attenuation curve in the case of $\beta = 1.0$ mg/V and R = 3.4 K$\Omega$ and a curve 12 represents the attenuation curve in the case when only the value of R is changed to 680 K$\Omega$.

As will be apparent from FIG. 2, a curve 12, by way of example, is characteristic of large attenuation amount, but if the control voltage $V_G$ is small, that is, the control voltage $V_G$ decreases to the vicinity of the threshold voltage $V_{th}$ of the FET 10, the attenuation amount is changed so quickly to increase the distortion factor. On the other hand, in the case of the curve 11, since the attenuation amount is not changed so quickly, the distortion factor is not influenced so much. However, there are drawbacks that its linearity is deteriorated and also the attenuation amount of the whole device can not be increased.

In any case, the attenuation circuit such as shown in FIG. 1 will not satisfy all the characteristics of linearity, attenuation amount and distortion factor.

SUMMARY OF THE INVENTION

It is the main object of this invention to provide an FET in which the characteristics of its linearity, attenuation amount and distortion factor are all improved.

It is another object of this invention to provide an FET which is simple in construction and low in price.

The other objects, features and advantages of the present invention will be apparent from the following description taken in conjunction with the accompanying drawings.

DESCRIPTION OF THE PREFERRED EMBODIMENTS

A description will hereinafter be given of one embodiment of an FET according to this invention with reference to the drawings.

Figure 3:
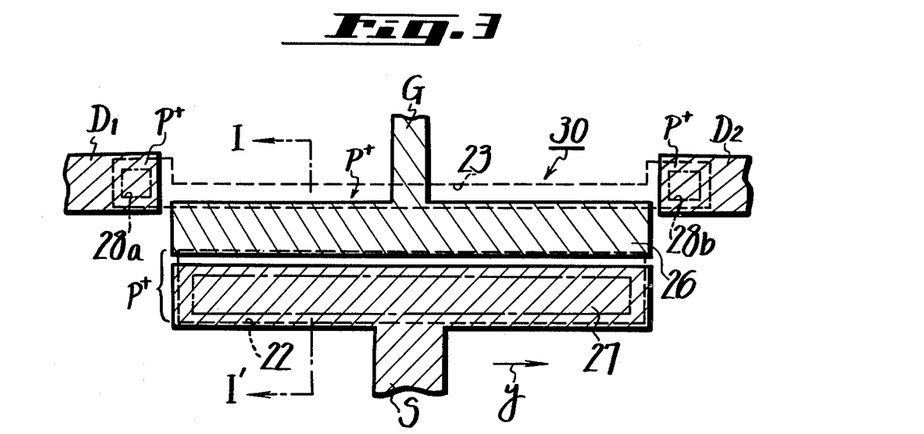
FIG. 3 is a plan view showing one example of an FET according to this invention.
Figure 4:
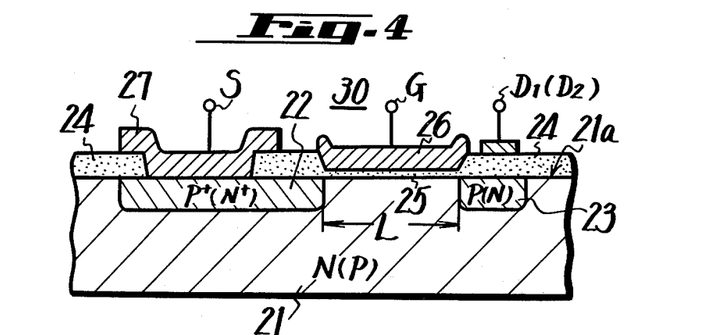
FIG. 4 is a cross-sectional view taken along a line I—I' of FIG. 3.

FIG. 3 is a plan view showing a basic construction of an FET according to this invention, and FIG. 4 is a cross-sectional view taken along a line I—I' of FIG. 3 in which a fundamental idea of this invention is introduced to an MOS-type FET.

For convenience of explanation, a description will first be given of FIG. 4. The cross-sectional view of FIG. 4 is substantially the same in construction as a normal MOS-FET, so that its detailed description will be omitted. However, reference numeral 30 designates an FET as a whole and 21 a semiconductor substrate of N-type (or P-type) conductivity. A P-type (or N-type) impurity is diffused from the upper surface 21a of the substrate 21 at predetermined positions with a predetermined distance being held therebetween to form a source diffusion region 22 and a drain diffusion region 23 which will hereinafter be referred to as a source region and a drain region, respectively. However, the regions formed by diffusion in this example are made differently such that the drain region 23 is smaller than the others, because the drain electrode leading-out portions are located outside its channel as shown in FIG. 3. The impurity concentration of the drain region 23 opposite to the channel is made substantially the same as or lower than that of other portions of the drain region where the electrodes $D_1$ and $D_2$ are led out therefrom. Reference numeral 24 indicates an insulating layer of $SiO_2$ or the like and 25 an insulating layer of $SiO_2$ or the like which is selected to have a predetermined thickness to serve as a gate oxide film as is well-known. On the upper surface of the insulating layer 25 there is formed by deposition a conductive layer 26 such as aluminum or the like serving as a gate electrode G, and similarly on the upper surface of the source region 22 there is formed by deposition a conductive layer 27 entirely over its surface which is served as a source electrode S.

In the example of this invention, the drain electrodes $D_1$ and $D_2$ are respectively led out from the opposite ends of the drain region 23 in a direction of channel width or y-direction in FIG. 3. In this case, the electrodes $D_1$ and $D_2$ are easily led out from positions respectively outside the channel formed between source and drain. In FIG. 3, the left electrode is taken as the first drain electrode $D_1$ and the right one as the second drain electrode $D_2$. For the sake of easy understanding, in FIG. 3 the source and drain regions 22 and 23 are indicated by broken lines, the conductive layers 26 and 27 by full lines, and windows 28a and 28b formed for leading-out the electrodes $D_1$ and $D_2$ by dash-chain lines, respectively. The FET shown in FIG. 3 is symbolized such as in FIG. 5.

Figure 5:
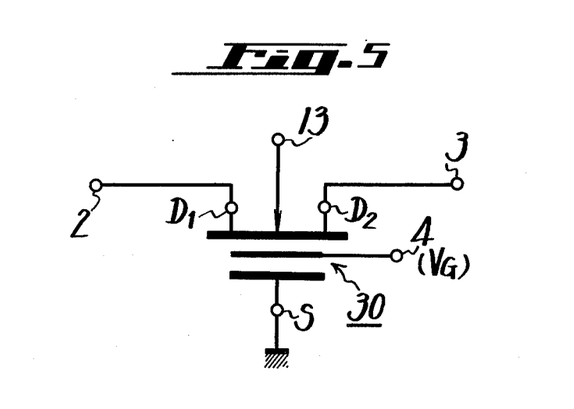
FIG. 5 is a view symbolizing the FET according to this invention.

In the case where the FET 30 is employed as an attenuating element of the attenuator circuit as shown in FIG. 1, the FET 30 is connected in series to the signal transmitting path l, that is, the first drain electrode $D_1$ is directly connected to the input terminal 2 not through the resistor 1 and the second drain electrode $D_2$ is connected to the output terminal 3, the source electrode S being grounded as depicted in FIG. 5. Reference numeral 13 denotes a back-gate terminal.

Figure 6:
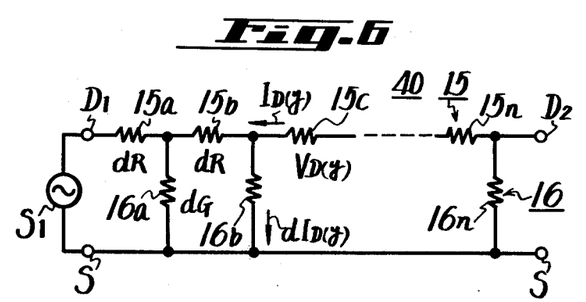
FIG. 6 is a view used for explaining the operation of the FET according to this invention.

With the above arrangement, if the control voltage $V_G$ is varied, the gain $g_2$ of the output signal is varied in a linear manner, the attenuation amount is made large and then the distortion factor is improved. The reason for the above will next be described with reference to an equivalent circuit 40 of the FET 30 shown in FIG. 6. A lateral resistive group 15 including resistors 15a, 15b, ..., 15n is a resistance of the drain region 23 in its channel width direction or y-direction and forms a kind of diffusion resistance. A longitudinal resistive group 16 including resistors 16a, 16b, ..., 16r is a channel conductance or each portion thereof. The resistance value of each element of the resistive group 15 is indicated as dR, and the conductance value of each element of the resistive group 16 as dG. Now, if = current flowing through the resistor 15c is taken as $I_D(y)$, a voltage thereacross as $V_D(y)$, and a current flowing through the resistor 16b as $dI_D(y)$, the following relations are obtained:

$$I_D(y) \, dR = dV_D(y) \tag{2}$$

$$dI_D(y) = V_D(y) \cdot dG \tag{3}$$

$$dR = \frac{R}{W} \cdot dy, \left( \int_0^w dR = R \right) \tag{4}$$

$$dG = \frac{\beta V_G}{W} \cdot dy, \left( \int_0^w dG = \beta V_G \right) \tag{5}$$

where R is a channel resistance and $\beta$ is a proportionally constant of the FET 30 which is the same as $\beta$ shown in FIG. 1.

Next, if the equation (2) is divided by dy, $$I_D(y) \frac{dR}{dy} = \frac{dV_D(y)}{dy} \tag{6}$$

If the equation (4) is substituted for the equation (6), $$I_D(y) \cdot \frac{R}{W} = \frac{dV_D(y)}{dy} \tag{7}$$

Therefore, if the equation (7) is further differentiated by y, the following equation is obtained:

$$\frac{dI_D(y)}{dy} \cdot \frac{R}{W} = \frac{d^2 V_D(y)}{dy^2} \tag{8}$$

On the other hand, if the equation (3) is divided by dy, $$\frac{dI_D(y)}{dy} = \frac{\beta V_G}{W} \cdot V_D(y) \tag{9}$$

Therefore, if the equation (9) is substituted for the equation (8) and the terms are replaced, the following differential equation is obtained:

$$\frac{d^2 V_D(y)}{dy^2} - \frac{\beta R}{W^2} \cdot V_G \cdot V_D(y) = 0 \tag{10}$$

Accordingly, the general solution of the above differential equation is given as follows:

$$V_D(y) = C_1 \cdot e^{\frac{\sqrt{\beta R V_G}}{W} \cdot y} + C_2 \cdot e^{-\frac{\sqrt{\beta R V_G}}{W} \cdot y} \tag{11}$$

Now, in the case when $V_D(0) = V_1$ and $V_D(W) = V_2$, and the mapping is taken into consideration, if the constants $C_1$ and $C_2$ are eliminated under the boundary condition of $V_D(2W) = V_1$, the equation (11) becomes as follows:

$$V_2 = \frac{V_1}{\cosh \sqrt{\beta R V_G}} \tag{12}$$

It will be obvious from the above equation (12) that the voltage gain $g_2$ ($g_2 = V_2/V_1$) expresses the inverse number of cosh, that is, the attenuation amount (dB) and hence the term $1/\cosh\sqrt{\beta R V_G}$ is shown by the curve 18 in FIG. 2.

As a result, the curve 18 of cosh which is varied according to the control voltage $V_G$ shows the features as follows:

1. The attenuation characteristics are good since the linearity is relatively excellent;
2. The attenuation amount becomes quite large such as about −80 dB at $V_G = 15V$; and
3. The rapid variation of attenuation is not caused even at a relating low control voltage $V_G$ such as being in a vicinity of the threshold voltage $V_{th}$ and hence the distortion factor is also improved.

As described above, in this invention the FET 30 is constructed with two drain electrodes, that is, the first and second drain electrodes $D_1$ and $D_2$ led-out from the opposite ends of the drain region 23 in a direction of channel width or y-direction. Accordingly, with the above construction, since the signal gain $g_2$ is proportional to the inverse number of cosh as shown by the equation (12), there are great advantages such that the attenuation characteristics having good linearity can be provided, its attenuation amount is increased as compared with the conventional MOS-FET and its distortion factor can also be improved. Of course, the FET 30 is so simple in construction that it can be provided at a low price.

Figure 7:
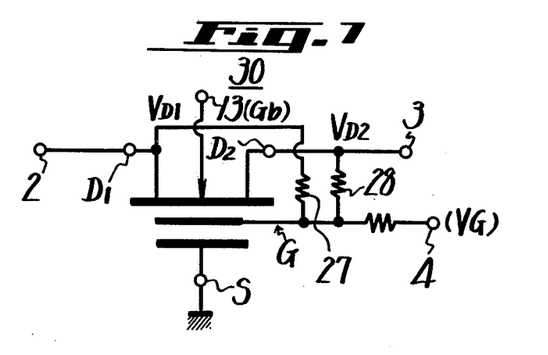
FIG. 7 is a circuit diagram showing another example of the FET of this invention when it is used as an attenuating element.

The fundamental construction, operation and characteristics of the FET 30 according to this invention have been described as in the foregoing. A description will next be given on various kinds of modified examples in which the aforesaid characteristics are improved with the fundamental idea being introduced therein. FIG. 7 shows an embodiment in which the first and second drain voltages $V_{D1}$ annd $V_{D2}$ are fed-back to the gate electrode G through resistors 27 and 28, respectively, to improve the distortion factor. It is well-known that distortion characteristics are normally improved by feeding-back a voltage to the gate in such a manner, so that its description will be omitted.

Figure 8:
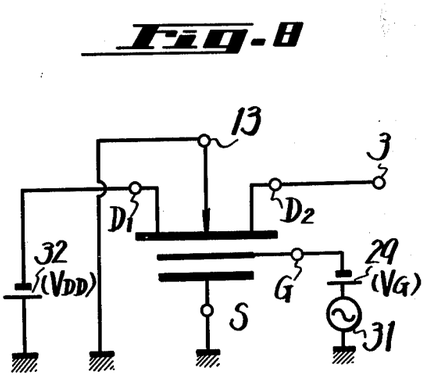
FIG. 8 is a circuit diagram showing a further example of the FET of this invention when it is used as an amplifying element.

In the case where the FET 30 is used not as the attenuating element but as the amplifying element in the same manner as the normal FET, if as shown in FIG. 8 an input signal source 31 is connected in series to a control voltage source 29 the voltage of which is applied to the gate electrode G and also the first drain electrode $D_1$ is grounded through a voltage source 32 while the output terminal 3 is led out from the second drain electrode $D_2$, the signal source 31 will be inserted between gate and source electrodes, so that the FET 30 will operate as the amplifying element. In this case, since the area of the drain region 23 is decreased to about ¼ the conventional one, its capacitance is also decreased with the result that the FET 30 is suitable for use in amplifying a high-frequency input signal and also usable as an amplifying element for an automatic gain control circuit because of its high gain. The FET 30 can also be employed as the amplifying element in a frequency mixer, a function generator and the like in addition to the above automatic gain control circuit. Besides, if two FETs 30 are directly connected, a direct-coupled amplifier is constructed, but its explanation will be omitted.

Figure 10:
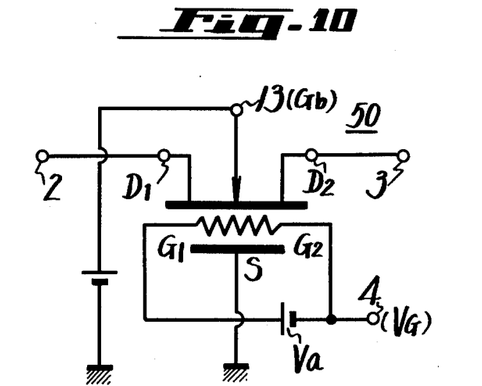
FIG. 10 is a view symbolizing a resistive gate type FET introduced with the idea of this invention.
Figure 14:
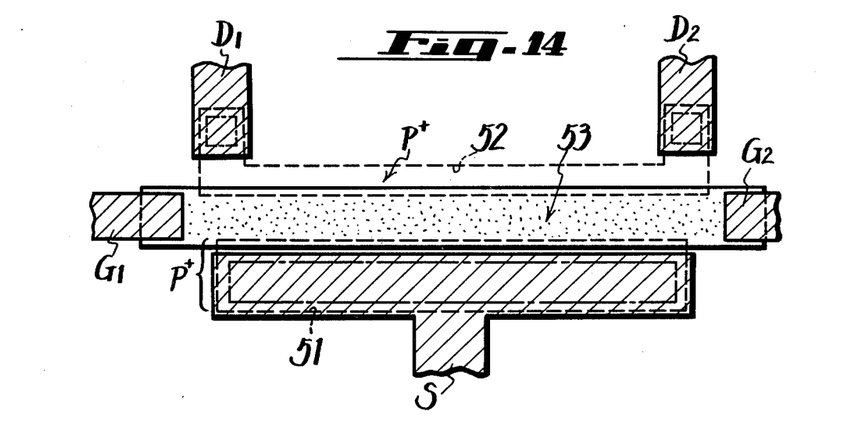
FIG. 14 is a plan view showing the resistive gate type FET of FIG. 10.

The above examples are described with respect to the normal MOS-FET, but another embodiment will be described with reference to FIGS. 10 and 14. In FIG. 14, there are provided a $P^+$-type source diffusion region 51 with its source electrode S and a $P^+$-type drain diffusion region 52 with its two drain electrodes $D_1$ and $D_2$. In this example, a resistive gate region 53 formed of a polycrystalline silicon layer is provided to form first and second gate electrodes $G_1$ and $G_2$ at its opposite ends in a direction to traverse its channel current. This FET is symbolized such as in FIG. 10, in which reference numeral 50 indicates the FET as a whole. The control voltage $V_G$ is applied in common to the gate electrodes $G_1$ and $G_2$ while a predetermined voltage $V_a$ is adapted to be applied therebetween. In this connection, if the voltage $V_G$ is varied from the threshold voltage $V_{th}$ to $V_{th}$ - $V_a$, the channel is first produced at a side of $D_2$ and then gradually expanded to a side of $D_1$. If the electrode $D_1$ is taken as an input side and the electrode $D_2$ as an output side, the attenuation characteristics of this FET 50 and its distortion factor become quite excellent. Further, the FET 50 is high in input resistance and low in output resistance.

In this example, the FET is used with a potential difference being applied to the resistive gate, but it can also be used with the gate potential being made inform by locally changing the threshold voltage $V_{th}$ by means of the channel portion or gate insulating film.

A description will hereinbelow be given of another example of this invention which is applied to a novel FET having good distortion factor of its element itself. This novel FET has already been proposed by the applicant of this invention and is of a resistive gate type in which a high resistive layer is provided between the insulating layer 25 and conductive layer 26 shown in FIG. 4 unlike the normal MOS-FET. This novel FET will be hereinafter referred to as an SRG and its schematic construction is shown in FIG. 9.

Figure 9:
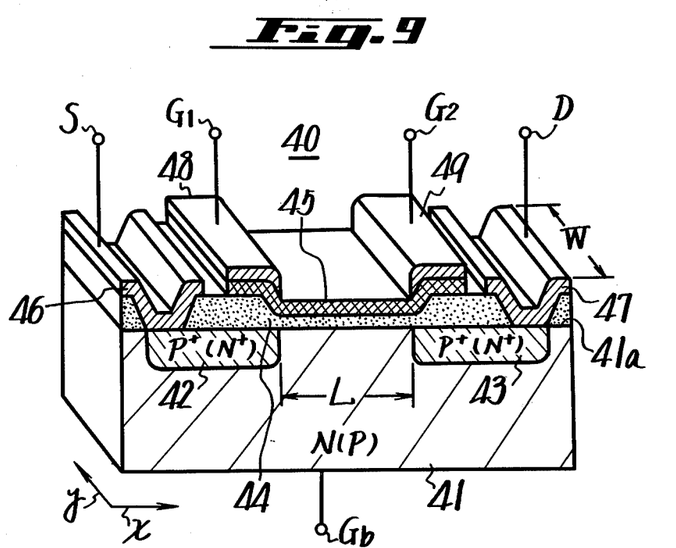
FIG. 9 is a structural view used for explaining a resistive gate type FET which is suitable for being introduced with an idea of this invention.

In FIG. 9, reference numeral 40 represents an SRG as a whole and 41 a semiconductor substrate of a first conductivity type, that is, N-type (or P-type). Facing to one major surface 41a of the semiconductor substrate 41 there are formed second conductivity type or P-type (or N-type) first and second regions 42 and 43, that is, source and drain regions with a predetermined distance L being held therebetween, and on the surface 41a between these regions 42 and 43 there is formed a gate insulating layer 44 made of, for example, $SiO_2$ and further on this insulating layer 44 there is formed a resistive layer 45. On the regions 42 and 43 there are respectively deposited a source electrode 46 and a drain electrode 47 in ohmic contact therewith and also on the resistive layer 45 there are deposited a first gate electrode 48 and a second gate electrode 49 at the sides of regions 42 and 43, respectively. With the above described construction, if the potentials of the source and drain regions 42 and 43 are respectively taken as $V_S$ and $V_D$, the first and second gate electrodes 48 and 49 are respectively applied with voltages which are obtained by superposing the potentials $V_S$ and $V_D$ on the gate control voltage $V_{GO}$. With such an arrangement, though its theoretical description is omitted, the uniform voltage $V_{GO}$ is always applied entirely all over the channel to avoid modulation according to drain voltage, thus an FET or SRG having superior linearity and improved distortion factor is obtained.

In other words, if a potential gradient is provided between source and drain in a channel lengthwise direction or x-direction, a linear resistance is obtained therebetween and its resistance value can be variably controlled by the voltage $V_G$.

Figure 11:
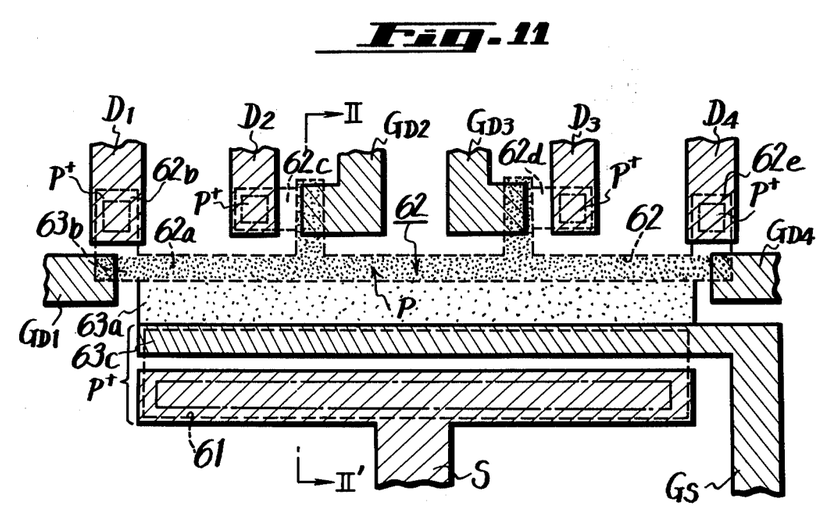
FIG. 11 is a plan view showing a further another example of the FET of this invention.
Figure 12:
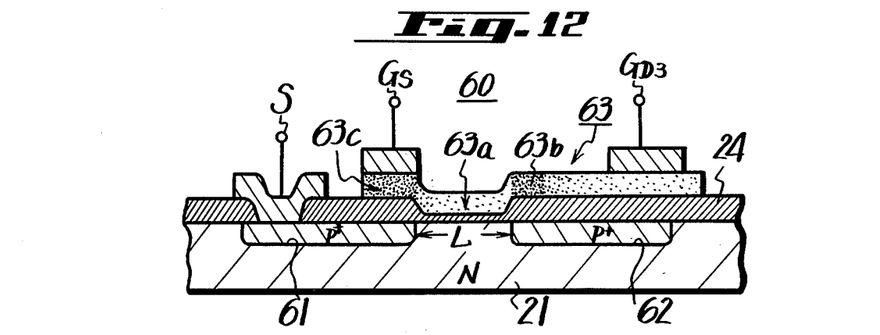
FIG. 12 is a cross-sectional view taken along a line II—II' of FIG. 11.
Figure 13:
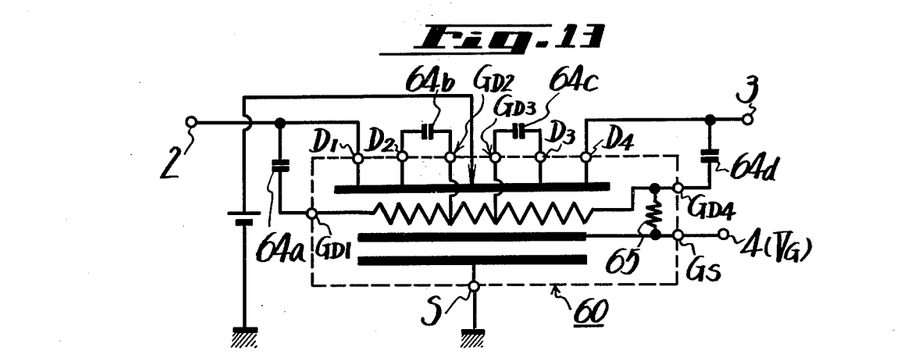
FIG. 13 is a view symbolizing the FET of FIG. 13.

In an embodiment shown in FIGS. 11 to 13, a potential gradient is provided to the gate electrodes in its channel lengthwise direction and also a potential gradient is provided to the drain region side in its channel widthwise direction thereby to obtain a linear resistance between first and second drain electrodes $D_1$ and $D_2$. FIG. 11 is a plan view showing the new FET 60, FIG. 12 is its cross-sectional view taken along a line II—II' of FIG. 11 and FIG. 13 is a view showing the symbol of this FET 60.

In this example, as shown in FIG. 11 a source region 61 and a drain region 62 are respectively formed with a distance L being held therebetween. The drain region 62 is selected to be smaller in area than the source region 61 as depicted in FIG. 11. However, in order to lead-out the drain electrodes from desired positions, for example, four positions, a strip-like main drain region 62a opposing to the channel has formed band-like electrode leading-out regions 62b and 62e which are extended therefrom at its both ends outward and in parallel with the channel lengthwise direction, and reverse-L-shaped plan-like electrode leading-out regions 62c and 62d which are outward extended therefrom at its substantially equally spaced positions in the channel widthwise direction. These electrode leading-out regions 62b to 62e are formed by deposition integrally with the main region 62a. The source and drain regions 61 and 62 are respectively shown by broken lines. As is apparent from FIG. 12, a resistive layer 63 made of polycrystalline silicon or the like is formed by deposition partially over the source region 61 and substantially all over the whole drain region 62, but impurities are diffused into the layer opposite to the regions 61 and 62 to make only these portions to be low resistive layers 63b and 63c having a predetermined resistance value. The high resistive layer 63a is made sufficiently high in resistance value as compared with the low resistive layers 63b and 63c.

On the source region 61 and the drain electrode leading-out regions 62b to 62e there are respectively provided a source electrode S and first to fourth drain electrodes $D_1$ to $D_4$. On the gate low resistive layer 63c corresponding to the source region 61 and the gate low resistive layer 63b corresponding to the drain electrode leading-out regions 62b to 62e, there are respectively provided gate electrodes $G_S$ and $G_{D1}$ to $G_{D4}$. Between each of the drain electrodes $D_1$ to $D_4$ and corresponding one of the gate electrodes $G_{D1}$ to $G_{D4}$, capacitors 64a to 64d are respectively connected from the outside as shown in FIG. 13. If the gate low resistive layer 63c is sufficiently large in area, the above external capacitors are not required. Reference numeral 65 in FIG. 13 represents the resistance of the gate high resistive layer 63a.

When the gate electrodes of the FET 60 are applied with the biasing voltage $V_{GO}$ in common and the channel conductance is made uniform as described in connection with FIG. 9, the following relation is obtained in case of $V_S = 0$:

$$V_{GD}(y) = V_{GO} + V_D(y) \tag{13}$$

$$V_{GS} = V_{GO} \tag{14}$$

where $V_{GD}$ is a gate potential at the drain side and $V_{GS}$ is a gate potential at the source side. The drain potential $V_D$ is uniformly varied along the y-direction, but the potential $V_{GD}$ is varied only in a linear manner in the region applied with a biasing voltage. Therefore, in order to select the value of $V_{GD}$ so that the equation (13) is satisfied irrespective of the value of y, as many intermediate taps as possible must be provided similarly as in the case of $G_{D2}$ and $G_{D3}$ of this example. The attenuation characteristics and the distortion factor of this FET 60 are extremely good.

As described above, the present invention is provides more than two electrodes in the drain region. In this case, even with the similar construction in the source region, a similar effect can be expected. It is also possible that a plurality of electrodes are provided at both the drain and source regions, and an input circuit is connected between source and drain electrodes for the one side while an output circuit is connected between source and drain electrodes for the other side. Besides, this invention is described with respect to the MOS-type FET, but it will be understood that the construction of a junction-type FET is also available.

While the principles of the invention have been described above in connection with specific embodiments, and particular modifications thereof, it is to be clearly understood that this description is made only by way of example and not as a limitation on the scope of invention.

I claim as my claim:

1. A field effect transistor comprising:
   a semiconductor substrate of one conductivity type;
   source and drain regions of opposite conductivity type respectively extending into said substrate from one surface thereof;
   a channel region formed between said source and drain regions, means connected to said source and drain regions for generating a channel current therebetween;
   said drain and source regions extending transversely of said channel region and having edges spaced on opposite ends of said channel region and said edges located and spaced apart transversely of said channel current, first and second drain electrodes electrically connected to said edges of said drain region;
   said drain region having a resistance between said edges which is higher than the resistance between the edges of said source region;
   an insulating layer formed on said channel region;
   a gate region formed on said insulating layer;
   a first gate electrode electrically connected to said gate region;
   a source electrode electrically connected to said source region;
   wherein said gate region is formed of electrically resistive material;
   including a second gate electrode, said first and second gate electrodes electrically connected to said gate region at points spaced apart transversely to said current; and
   wherein said field effect transistor is a variable impedance means including an input circuit connected to said first drain and source electrodes, an output circuit connected to said second drain and source electrodes, and a control circuit connected to said first and second gate electrodes.

2. A field effect transistor according to claim 1 in which different control voltages are applied to said first and second gate electrodes so that the input impedance to said input circuit is higher than the output impedance to said output circuit.

3. A field effect transistor comprising:
   a semiconductor substrate of one conductivity type;

source and drain regions of opposite conductivity type respectively extending into said substrate from one surface thereof;

a channel region formed between said source and drain regions, means connected to said source and drain region for generating a channel current therebetween;

said drain and source regions having edges spaced on opposite ends of said channel region and said edges located and spaced apart transversely of said channel current, first and second drain electrodes electrically connected to said edges of said drain region;

said drain region having a resistance between said edges which is higher than the resistance between the edges of said source region;

an insulating layer formed on said channel region;

a gate region formed on said insulating layer;

a first gate electrode electrically connected to said gate region;

a source electrode electrically connected to said source region;

wherein said gate region is formed of electrically resistive material; and including second and third gate electrodes, said first, second and third gate electrodes respectively mounted adjacent said source, first drain and second drain electrodes.

4. A field effect transistor according to claim 3 further including at least one further drain electrode electrically connected to said drain region at a point between said first and second drain electrodes.

5. A field effect transistor according to claim 3 where said transistor is a variable impedance means, including an input circuit connected to said first drain and source electrodes, an output circuit connected to said second drain and source electrodes, a control circuit connected to said first gate electrode, and capacitance means coupled between said drain region and said gate region corresponding thereto.

6. A field effect transistor comprising:

a semiconductor substrate of one conductivity type;

a source region and a single drain region with multiple electrodes of opposite conductivity type respectively extending into said substrate from one surface thereof;

a channel region formed between said source and drain regions, means connected to said source and drain region for generating a channel current therebetween, said drain and source regions extending transversely of said channel region and having edges spaced on opposite ends of said channel region and said edges located and spaced apart transversely of said channel current, first and second drain electrodes electrically connected to said edges of said single drain region;

said drain region having a resistance between said edges which is higher than the resistance between the edges of said source region;

an insulating layer formed on said channel region;

a gate region formed on said insulating layer;

a first gate electrode electrically connected to said gate region;

a source electrode electrically connected to said source region;

wherein the resistivity of said gate region is higher than that of said gate electrode, and including a second gate electrode, said first and second gate electrodes electrically connected to said gate region at points spaced apart transversely to said current.

* * * * *